United States Patent
Hoshi et al.

(10) Patent No.: US 11,915,978 B2
(45) Date of Patent: Feb. 27, 2024

(54) TRANSISTOR MANUFACTURING METHOD

(71) Applicant: Nippon Telegraph and Telephone Corporation, Tokyo (JP)

(72) Inventors: Takuya Hoshi, Tokyo (JP); Yuki Yoshiya, Tokyo (JP); Hiroki Sugiyama, Tokyo (JP); Hideaki Matsuzaki, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 497 days.

(21) Appl. No.: 17/291,668

(22) PCT Filed: Nov. 15, 2019

(86) PCT No.: PCT/JP2019/044863
§ 371 (c)(1),
(2) Date: May 6, 2021

(87) PCT Pub. No.: WO2020/110773
PCT Pub. Date: Jun. 4, 2020

(65) Prior Publication Data
US 2021/0398857 A1    Dec. 23, 2021

(30) Foreign Application Priority Data
Nov. 29, 2018 (JP) ................. 2018-223140

(51) Int. Cl.
| | |
|---|---|
| H01L 29/66 | (2006.01) |
| H01L 21/78 | (2006.01) |
| H01L 21/02 | (2006.01) |
| H01L 29/04 | (2006.01) |
| H01L 29/20 | (2006.01) |

(Continued)

(52) U.S. Cl.
CPC ...... *H01L 21/7806* (2013.01); *H01L 21/0242* (2013.01); *H01L 21/0254* (2013.01); *H01L 21/02378* (2013.01); *H01L 21/02381* (2013.01); *H01L 21/02389* (2013.01); *H01L 21/02609* (2013.01); *H01L 29/045* (2013.01); *H01L 29/2003* (2013.01); *H01L 29/205* (2013.01); *H01L 29/66462* (2013.01); *H01L 29/7786* (2013.01)

(58) Field of Classification Search
CPC ................. H01L 29/66431; H01L 29/66462
See application file for complete search history.

(56) References Cited

U.S. PATENT DOCUMENTS

| | | | | |
|---|---|---|---|---|
| 7,732,301 | B1 * | 6/2010 | Pinnington | ......... H01L 21/2654 438/455 |
| 2009/0072243 | A1 * | 3/2009 | Suda | ...................... G02F 1/3775 257/77 |

OTHER PUBLICATIONS

Dang, G.T., "p-Ohmic contact resistance for GaAs(C)/GaN(Mg)," Solid-State Electronics, Pergamon, May 11, 1999, 5 pages.

(Continued)

*Primary Examiner* — Jae Lee
(74) *Attorney, Agent, or Firm* — Slater Matsil, LLP

(57) ABSTRACT

A first regrowth layer and a second regrowth layer comprising GaAs having high resistance are regrown on a surface of an etching stop layer exposed to the bottom of a first groove and a second groove, and then n-type InGaAs is regrown on the first regrowth layer and the second regrowth layer, whereby a source region and a drain region configured to make contact with a channel layer are formed in the first groove and the second groove respectively.

17 Claims, 10 Drawing Sheets

(51) Int. Cl.
*H01L 29/205* (2006.01)
*H01L 29/778* (2006.01)

(56) References Cited

OTHER PUBLICATIONS

Mei, Xiaobing, "First Demonstration of Amplification at 1 THz Using 25-nm InP High Electron Mobility Transistor Process," IEEE Electron Device Letters, vol. 36, No. 4, Apr. 2015, 3 pages.
Shinohara, K., "Self-Aligned-Gate GaN-HEMTs with Heavily-Doped n+-GaN Ohmic Contacts to 2DEG," IEEE International Electron Devices Meeting, Dec. 10-13, 2012, 4 pages.

* cited by examiner

TRANSISTOR MANUFACTURING METHOD

This patent application is a national phase filing under section 371 of PCT/JP2019/044863, filed Nov. 15, 2019, which claims the priority of Japanese patent application no. 2018-223140, filed Nov. 29, 2018, each of which is incorporated herein by reference in its entirety.

TECHNICAL FIELD

The present invention relates to a manufacturing method for transistors, and more particularly relates to a manufacturing method for transistors constituted of a nitride semiconductor and a semiconductor such as GaAs or InP.

BACKGROUND

A nitride semiconductor such as gallium nitride (GaN), aluminum nitride (AlN), or AlGaN or InAlGaN, which is a mixed crystal material thereof, has a large band gap and a high dielectric breakdown electric field strength compared to semiconductor materials such as GaAs and Si. With such features, high breakdown voltage characteristics can be achieved when an electronic device such as a transistor is constituted of a nitride semiconductor. The nitride semiconductor has a crystal structure of hexagonal crystal and has a polarization in the c-axial direction. Due to effects of this polarization, a heavily concentrated sheet carrier (two-dimensional electron gas) at approximately $10^{13}$ cm$^{-3}$ is spontaneously formed by forming a heterojunction between AlGaN and GaN, for example. With this sheet carrier, it is possible to achieve a well-known high electron mobility transistor (HEMT).

A HEMT using a GaN-based nitride semiconductor will be described with reference to FIG. 3. In the HEMT, first, a buffer layer 302 formed by epitaxial growth, a channel layer 303, and a barrier layer 304 are layered sequentially on a substrate 301. The substrate 301 may be constituted of sapphire, Si, SiC, and single-crystal GaN. The channel layer 303 is constituted of GaN, and the barrier layer 304 is constituted of AlGaN.

The barrier layer 304 and the channel layer 303 differ in magnitude of polarization, thereby forming a sheet carrier on the channel layer 303 side of the interface between the barrier layer 304 and the channel layer 303. With respect to this semiconductor layer structure, by a well-known semiconductor manufacturing process, a gate electrode 311 is formed on the barrier layer 304, and a source electrode 312 and a drain electrode 313 are formed with the gate electrode 311 interposed therebetween. The gate electrode 311 takes a so-called Schottky connection, and the source electrode 312 and the drain electrode 313 are ohmic-connected to the channel layer 303.

In the HEMT described above, each of the layers is formed by crystal growth of a nitride semiconductor in the +c-axis direction on the substrate 301, and in this case, the barrier layer 304 is disposed on the channel layer 303, thereby forming a sheet carrier on the channel layer 303 side of the interface between the barrier layer 304 and the channel layer 303. In contrast, when the crystal growth of the nitride semiconductor is conducted in the −c-axis direction, by disposing the channel layer on the barrier layer, a sheet carrier is formed on the channel layer side of the interface therebetween. In a case where a channel layer is also disposed on the barrier layer when viewed from the substrate, forming the gate electrode directly on the channel layer may cause an increase in gate leakage or the like, so that the desired characteristics may not be exhibited. As such, in this case, a nitride semiconductor layer having a band gap greater than the band gap of the channel layer is formed on the channel layer, for example, and the gate electrode to be Schottky-connected is formed on the nitride semiconductor layer. For example, in the case where the channel layer is constituted of GaN, the nitride semiconductor layer is constituted of AlGaN.

The above-discussed HEMT (GaN-based HEMT) using a GaN-based nitride semiconductor has already been achieved and put into practical use in radio communication applications requiring high frequencies of several gigahertz or more and high output of several hundred watts. In the future, a GaN-based HEMT improved in high frequency characteristics for use in a range approximately from several tens of gigahertz to hundreds of gigahertz will be needed toward a further expansion of the wireless communication capacity. A reduction in contact resistance of the source and drain regions is important for improving the high frequency characteristics of the GaN-based HEMT.

Note that GaN is a wide gap material, and therefore has a high dielectric breakdown electric field strength, but it is difficult to reduce contact resistance when an ohmic electrode is formed on the GaN layer. The reason for this is that GaN itself has high resistance and the reduction in contact resistance is restricted even when heavy doping is carried out. In addition, in the GaN-based HEMT discussed above, it is necessary to form a contact with each of the electrodes via a layer of AlGaN or the like having a larger band gap and higher resistance than GaN, thereby making the contact resistance higher.

One of the schemes for reducing the contact resistance between the source and drain electrodes and the channel layer in the GaN-based HEMT discussed above includes regrowth of the source and drain regions for connection with the source and drain electrodes. Since the GaN-based HEMT forms ohmic contacts in the channel layer made of GaN via a layer of AlGaN or the like, the contact resistance is restricted by high resistance of AlGaN. In order to prevent this situation, for example, there exists a technique in which contact resistance is reduced by forming heavily doped GaN in the source and drain regions by regrowth (Non Patent Literature (NPL) 1).

By this technique, the contact resistance described above is reduced down to 0.026 Ω*mm. This contact resistance value is comparable to the contact resistance 4 Ψ*mm of an InAs channel HEMT having characteristics of maximum oscillation frequency $f_{max}$>1 THz (NPL 2). However, although the contact resistance value can be made small, the performance of the GaN-based HEMT is restricted to a relation of $f_{max}$=518 GHz.

Furthermore, as a scheme for reducing the contact resistance to broaden the frequency band of a GaN-based HEMT, a technique is conceivable in which a material is regrown that is more likely to be reduced in resistance by heavy doping than GaN-based materials such as GaAs, InP, InGaAs, and InAs. For example, in NPL 3, an attempt to grow GaAs on GaN is reported. GaAs is able to become an n-type material by being doped with Si. In reality, it is described in NPL 3 that a p-type GaAs layer heavily doped up to $10^{19}$ to 1020 cm$^{-3}$ is successfully grown on a GaN layer. However, since the crystal structures of GaAs and GaN differ from each other, and the lattice-mismatch in the planar direction at the interface between the two layers is significantly large, hetero-growth with respect to the materials having different structures as discussed above is difficult to achieve, thereby raising problems such as degradation in crystal quality, worsened flatness, and the like.

CITATION LIST

Non Patent Literature

NPL 1: K. Shinohara et al., "Self-Aligned-Gate GaN-HEMTs with Heavily-Doped n+-GaN Ohmic Contacts to 2DEG", IEEE International Electron Devices Meeting, 13384135, 2012.
NPL 2: X. Mei et al., "First Demonstration of Amplification at 1 THz Using 25-nm InP High Electron Mobility Transistor Process", IEEE Electron Device Letters, vol. 36, no. 4, pp. 327-329, 2015.
NPL 3: G. T. Dang et al., "p-Ohmic contact resistance for GaAs(C)/GaN(Mg)", Solid-State Electronics, vol. 44, pp. 105-109, 2000.

SUMMARY

Technical Problem

A reduction in ohmic contact resistance of the source and drain electrodes is essential for further broadening the high frequency operation band of the GaN-based HEMT. However, as described above, since GaN is a wide gap material, the reduction in contact resistance is restricted. One possible solution to reduce contact resistance may be that a semiconductor material capable of being heavily doped, such as GaAs, is regrown in the source and drain regions. However, because the growth is conducted with respect to different kinds of materials, there is a problem such that a high quality crystal is difficult to obtain due to a large lattice-mismatch and a difference in crystal structure.

As described above, in the techniques of the related art, there is a problem in which the reduction in contact resistance of the source and drain electrodes of a transistor using a nitride semiconductor such as a GaN-based HEMT is restricted, thereby obstructing further expansion of the high frequency operation band of the GaN-based HEMT.

Embodiments of the present invention have been conceived to solve the above problems, and an object thereof is to make it possible to further reduce contact resistance of the source and drain electrodes of a transistor using a nitride semiconductor.

Means for Solving the Problem

A manufacturing method for a transistor according to embodiments of the present invention includes: (i) causing crystals of a barrier layer and a channel layer made of a nitride semiconductor to grow in a c-axis direction on a first substrate; (ii) preparing a second substrate made of a semiconductor with no nitrogen contained; (iii) bonding the second substrate to a side of the barrier layer and the channel layer of the first substrate; (iv) removing the first substrate to achieve a state in which the barrier layer and the channel layer are formed on the second substrate; (v) forming, after the first substrate is removed, a first groove and a second groove in the barrier layer and the channel layer, the first and second grooves passing through the barrier layer and the channel layer with a region, in which a gate electrode is to be formed, interposed between the first groove and the second groove; (vi) forming, in the first groove and the second groove, a source region and a drain region in contact with the channel layer by regrowing a semiconductor with no nitrogen contained in which impurities are injected from a side of a bottom surface of the first groove and from a side of a bottom surface of the second groove; (vii) forming a source electrode to be ohmic-connected on the source region and forming a drain electrode to be ohmic-connected on the drain region; and (viii) forming the gate electrode over the barrier layer and the channel layer between the source electrode and the drain electrode.

In one configuration example of the manufacturing method for the transistor, a first bonding layer is formed on the barrier layer in step (i), a second bonding layer is formed on the second substrate in step (ii), and the first substrate and the second substrate are bonded to each other in a state in which the first bonding layer and the second bonding layer face each other in step (iii).

In one configuration example of the manufacturing method for the transistor, the first substrate is removed along with part of the barrier layer in step (iv).

In one configuration example of the manufacturing method for the transistor, the barrier layer and the channel layer are formed on the first substrate with a sacrificial layer interposed between the barrier layer or the channel layer and the first substrate in step (i), and the first substrate is removed along with part of the sacrificial layer in step (iv).

In one configuration example of the manufacturing method for the transistor, in step (i), the channel layer and the barrier layer are grown to be formed in that order on the first substrate by crystal growth in a +c-axis direction, and a gate isolation layer comprising a material having a larger band gap than a band gap of the channel layer is formed in contact with the channel layer on the first substrate side of the channel layer, and in step (viii), the gate electrode is formed on the gate isolation layer.

In one configuration example of the manufacturing method for the transistor, the barrier layer and the channel layer are grown to be formed in that order on the first substrate by crystal growth in a −c-axis direction in step (i), and the gate electrode is formed on the barrier layer in step (viii).

In one configuration example of the manufacturing method for the transistor, the first substrate comprises sapphire, Si, SiC, GaN, or AlN, and the second substrate comprises GaAs, InP, or Si.

In one configuration example of the manufacturing method for the transistor, the channel layer comprises GaN, InGaN, InN or AlGaN, or a layered structure comprising materials selected from the group consisting of GaN, InGaN, InN and AlGaN, and the barrier layer comprises AlGaN, InAlN, InAlGaN, AlN or GaN, or a layered structure comprising materials selected from the group consisting of AlGaN, InAlN, InAlGaN, AlN and GaN.

Effects of Embodiments of the Invention

As described above, in embodiments of the present invention, a second substrate made of a semiconductor with no nitrogen contained is bonded to a first substrate on which crystals of a barrier layer and a channel layer made of a nitride semiconductor are grown in the c-axis direction, a first groove and a second groove are formed passing through the barrier and channel layers after having removed the first substrate, and a source region and a drain region in contact with the channel layer are formed in the first groove and the second groove. As a result, according to embodiments of the present invention, an excellent effect is obtained in which the contact resistance of the source and drain electrodes of a transistor using a nitride semiconductor is further decreased.

DETAILED DESCRIPTION OF ILLUSTRATIVE EMBODIMENTS

Manufacturing methods for transistors according to embodiments of the present invention will be described below.

First Embodiment

First, a manufacturing method for a transistor in a first embodiment of the present invention will be described with reference to FIGS. 1A to 1K.

Figure 1A:
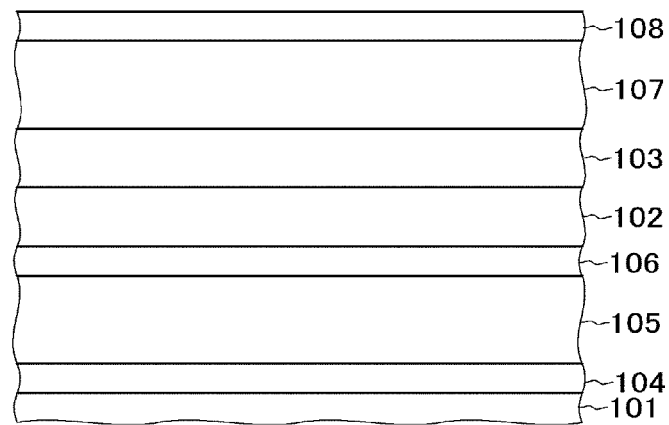
FIG. 1A is a cross-sectional view illustrating a cross section of a transistor in an intermediate stage for describing a manufacturing method for the transistor in a first embodiment of the present invention.

First, as illustrated in FIG. 1A, a channel layer 102 and a barrier layer 103 made of a nitride semiconductor are formed on a first substrate 101 (first step). In the first embodiment, the channel layer 102 and the barrier layer 103 are grown to be formed in that order on the first substrate 101 by the crystal growth in the +c-axis direction. In addition, in the first embodiment, after a nucleation layer 104, a sacrificial layer 105, and a gate isolation layer 106 are formed on the first substrate 101, the channel layer 102 and the barrier layer 103 are formed, and a first main bonding layer 107 and a first sub bonding layer 108 are formed on the barrier layer 103. In the first embodiment, the gate isolation layer 106 is formed on the first substrate 101 side of the channel layer 102.

The nucleation layer 104, the sacrificial layer 105, the gate isolation layer 106, the first main bonding layer 107, and the first sub bonding layer 108 are also formed by the crystal growth in the +c-axis direction. Due to the crystal growth in the +c-axis direction, by forming the barrier layer 103 on the channel layer 102, a sheet carrier heavily concentrated at approximately $10^{13}$ cm$^{-3}$ is formed spontaneously in a heterojunction between the channel layer 102 and the barrier layer 103.

The first substrate 101 is constituted of, for example, $Al_2O_3$ (sapphire), and the plane orientation of the principal surface is, for example, (0001). The first substrate 101 may also be constituted of SiC, single-crystal Si, or the like, and may also be constituted of a material that can be used for growing a nitride semiconductor such as GaN or AlN. As will be described later, for removing the first substrate 101, for example, it is more preferable to use Si, which makes it possible to remove the substrate by dry etching, or $Al_2O_3$, which makes it possible to apply a known peeling technique such as laser lift off, but the present invention is not limited thereto.

The nucleation layer 104 is constituted of GaN, for example. As is well known, the nucleation layer 104 is a layer configured to support the nucleation of the initial growth to obtain a high quality and flat crystal in order to grow the crystal of a nitride semiconductor such as GaN on different kinds of substrates of $Al_2O_3$, Si, SiC, and the like. The nucleation layer 104 has various nomenclatures such as a low temperature buffer layer and a low temperature buffer. By adjusting the nucleation layer 104, the surface of the nucleation layer 104 is made to be a group III polar face. By making the surface of the nucleation layer 104 be a group III polar face, the nitride semiconductor crystal grows in the +c-axis direction thereupon. The nucleation layer 104 is not limited to GaN, and may also be constituted of other nitride materials such as AlN and AlON. Note that in a case where the first substrate 101 is constituted of GaN, the nucleation layer 104 may not be necessary.

The sacrificial layer 105 is constituted of GaN, for example. The sacrificial layer 105 is used to remove the first substrate 101, which will be described later, and is used to flatten the surface of the semiconductor layer structure after removing the first substrate 101. For this purpose, the thickness of the sacrificial layer 105 is set as appropriate to be, for example, equal to or thicker than wo nm in accordance with a removal process of the first substrate 101. The sacrificial layer 105, together with the nucleation layer 104, also functions as a buffer layer for a layer to perform crystal growth above the sacrificial layer 105.

The gate isolation layer 106 is constituted of a material having a larger band gap than that of the channel layer 102, such as AlGaN. The gate isolation layer 106 is typically constituted of AlGaN in which an Al composition is set to approximately 0.10. The gate isolation layer 106 is formed to have a thickness of approximately 20 nm. The gate isolation layer 106 is also used as an etching stop layer for removing the sacrificial layer 105 by selective etching in a process after having removed the first substrate 101, which will be described later.

The channel layer 102 is constituted of GaN, for example. The barrier layer 103 is constituted of AlGaN. The thickness of the channel layer 102 and the thickness of the barrier layer 103 are determined in consideration of the desired sheet resistance and mobility of the HEMT, the critical film thickness of the entire layered structure to epitaxially grow, and the like. The barrier layer 103 may be formed in contact with the channel layer 102, or a spacer layer constituted of AlN, for example, may be disposed between the barrier layer 103 and the channel layer 102. In addition, the barrier layer 103 constituted of AlGaN may also have a configuration in which, for example, the Al composition gradually changes in a direction away from the channel layer 102 relative to the channel layer 102 side.

The first main bonding layer 107 is constituted of GaN, and the first sub bonding layer 108 is constituted of GaN, which is doped with C to have high resistance. By constituting the bonding layers formed of a plurality of layers in this manner, it is possible to suppress the introduction of crystal defects into the channel layer 102 and the barrier layer 103 in the bonding process to be described later.

Each of the layers described above may be formed by a well-known metal-organic chemical vapor deposition method. Furthermore, each of the layers described above may also be formed by molecular beam epitaxy (classified into gas source, RF plasma source, laser and the like, any of which may be employed), hydride vapor phase epitaxy, sputtering, other chemical vapor deposition (CVD) methods, or the like.

Figure 1B:
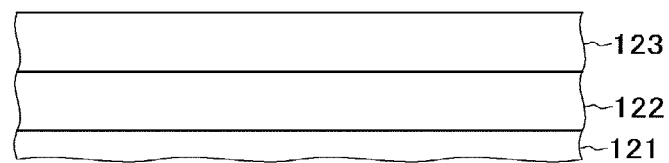
FIG. 1B is a cross-sectional view illustrating a cross section of a transistor in an intermediate stage for describing the manufacturing method for the transistor in the first embodiment of the present invention.

Next, as illustrated in FIG. 1B, a second substrate 121 made of a semiconductor with no nitrogen contained is prepared (second step). The second substrate 121 is constituted of a material able to regrow a material that can be more heavily doped with impurities and is easily reduced in resistance when forming the source region and the drain region by a regrowth process to be explained later. Examples of the material that can be more heavily doped with impurities and is easily reduced in resistance include a nitrogen-free group III-V compound semiconductor such as GaAs or InP. The second substrate 121 may also be constituted of Si. In the first embodiment, the second substrate 121 is constituted of GaAs with high resistance.

In the first embodiment, an etching stop layer 122 made of InGaAsP is formed on the second substrate 121 by epitaxial growth, and a second bonding layer 123 made of GaAs with high resistance is formed.

Figure 1C:
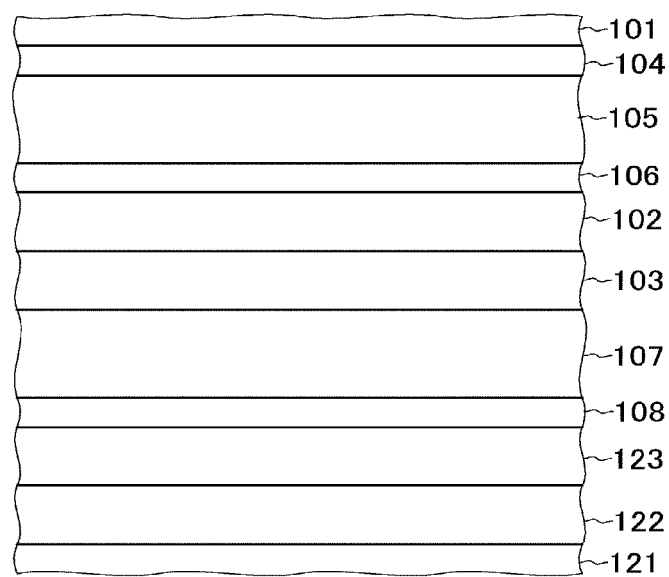
FIG. 1C is a cross-sectional view illustrating a cross section of a transistor in an intermediate stage for describing the manufacturing method for the transistor in the first embodiment of the present invention.

Next, as illustrated in FIG. 1C, the second substrate 121 is bonded to the side of the barrier layer 103 and the channel layer 102 of the first substrate 101 (third step). In the first embodiment, the second bonding layer 123 of the second substrate 121 is bonded to the first sub bonding layer 108 of the first substrate 101, thereby bonding the first substrate 101 and the second substrate 121 to each other. This bonding is carried out by a well-known wafer bonding technique such as surface-activated bonding, fusing with high temperature heat treatment, or atom diffusion bonding. In the regrowth of the source and drain regions to be described below, the crystal growth temperature may be relatively high, and thus a bonding technique able to obtain a bonding state capable of withstanding this temperature is used.

Figure 1D:
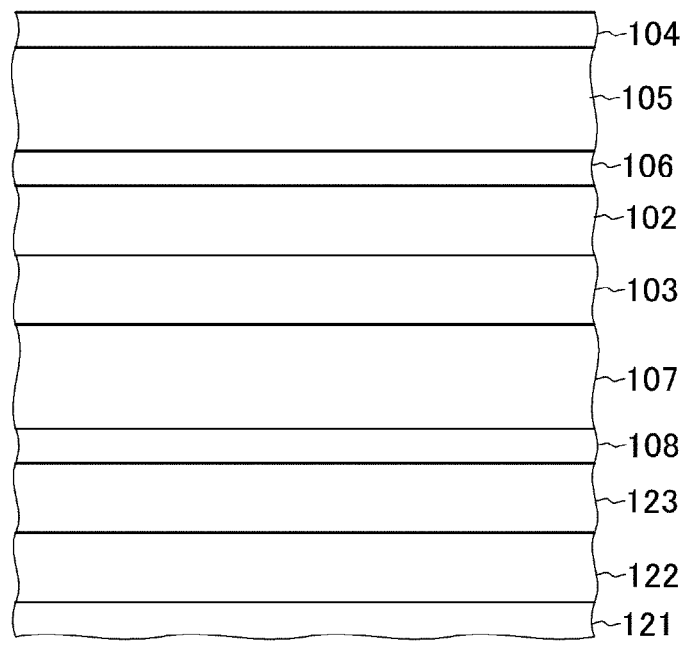
FIG. 1D is a cross-sectional view illustrating a cross section of a transistor in an intermediate stage for describing the manufacturing method for the transistor in the first embodiment of the present invention.

Next, the first substrate 101 is removed to obtain a state in which, as illustrated in FIG. 1D, the barrier layer 103 and the channel layer 102 are formed in that order on the second substrate 121 (fourth step). In the first embodiment, the etching stop layer 122, the second bonding layer 123, the first sub bonding layer 108, the first main bonding layer 107, the barrier layer 103, the channel layer 102, the gate isolation layer 106, the sacrificial layer 105, and the nucleation layer 104 are formed in that order on the second substrate 121.

For example, the first substrate 101 is removed by peeling the first substrate 101 from the nucleation layer 104 by a known laser lift off method. It is also possible to shave off the first substrate 101 by backgrinding and dry etching. The removal of the first substrate 101 is carried out by a method not having such an unwanted influence that the barrier layer 103 and the channel layer 102 are damaged to cause deterioration in characteristics of the transistor.

The sacrificial layer 105 is then thinned. The sacrificial layer 105 is removed to expose the surface of the gate isolation layer 106 as described below. In removing the sacrificial layer 105, for example, an etching process is used in which the sacrificial layer 105 serves as an etching stop layer. The sacrificial layer 105 is thinned in accordance with the magnitude of the etch selectivity that may be taken between the gate isolation layer 106 and the sacrificial layer 105 in the stated etching process. In removing the sacrificial layer 105 by the etching process, the flatness of the surface of the sacrificial layer 105 may be transferred to the surface of the gate isolation layer 106. Because of this, the sacrificial layer 105 is thinned and the surface thereof is flattened.

Figure 1E:
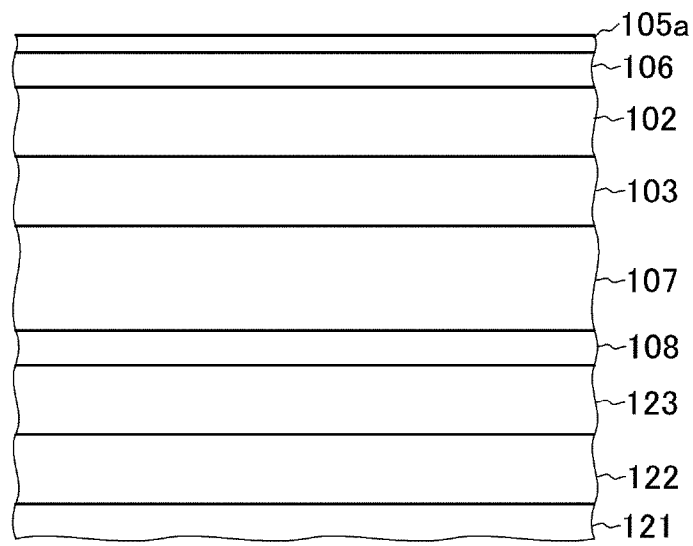
FIG. 1E is a cross-sectional view illustrating a cross section of a transistor in an intermediate stage for describing the manufacturing method for the transistor in the first embodiment of the present invention.

For example, by well-known chemical mechanical polishing (CMP), the sacrificial layer 105 is ground and polished so as to flatten the surface of the sacrificial layer 105 and thin the sacrificial layer 105. The thickness of the sacrificial layer 105, which is shaved by the CMP, depends on a state of the removal of the first substrate 101 in the previous process, and a state of the sacrificial layer 105 after the removal of the first substrate 101. For example, when surface roughness of the sacrificial layer 105 is several nanometers in size due to the removal of the first substrate 101, grinding and polishing of a thickness of approximately several hundred nanometers is carried out by the CMP in order to remove portions of the sacrificial layer 105 damaged in terms of flatness across the entire area in the planar direction. In the case where the sacrificial layer 105 is formed to have a thickness of 1000 nm or greater, not all of the sacrificial layer 105 is lost even when it is thinned by the CMP discussed above. As illustrated in FIG. 1E, by the flattening and thinning processes described above, a thinned sacrificial layer 105a remains on the gate isolation layer 106.

Figure 1F:
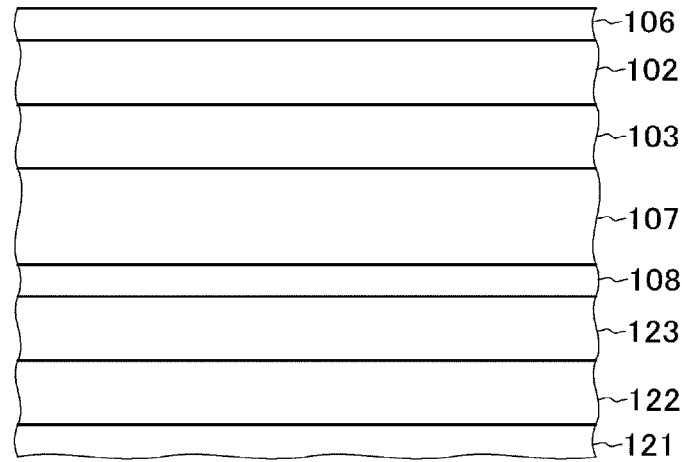
FIG. 1F is a cross-sectional view illustrating a cross section of a transistor in an intermediate stage for describing the manufacturing method for the transistor in the first embodiment of the present invention.

Subsequently, the thinned sacrificial layer 105a is removed to expose a surface of the gate isolation layer 106, as illustrated in FIG. 1F. Since the sacrificial layer 105a is constituted of GaN, and the gate isolation layer 106 is constituted of AlGaN, it is possible to remove the sacrificial layer 105a by a dry etching process using a chlorine gas, nitrogen gas, or oxygen gas with the gate isolation layer 106 serving as an etching stop layer, for example.

Figure 1G:
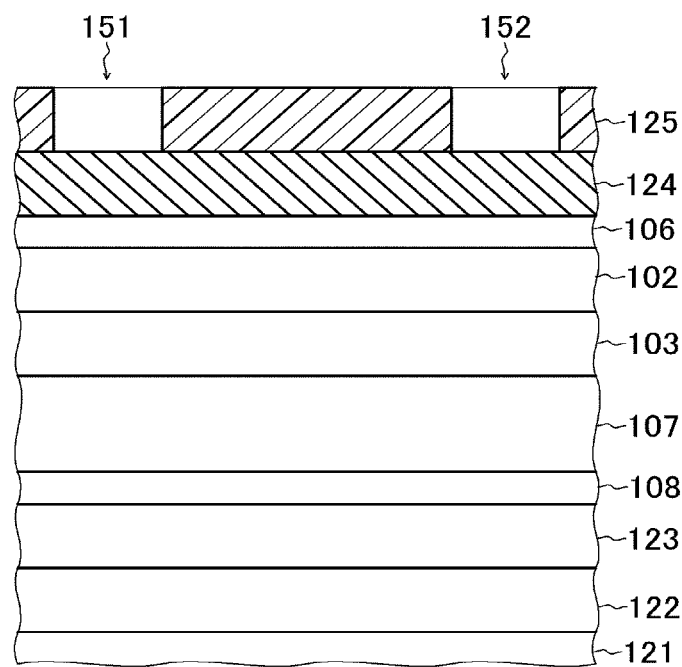
FIG. 1G is a cross-sectional view illustrating a cross section of a transistor in an intermediate stage for describing the manufacturing method for the transistor in the first embodiment of the present invention.

Next, as illustrated in FIG. 1G, a silicon oxide layer 124 is formed on the gate isolation layer 106, and a mask layer 125 provided with openings 151 and 152 is formed on the silicon oxide layer 124. For example, silicon oxide is deposited by a well-known deposition method to form the silicon oxide layer 124. Next, a positive-type photoresist material, for example, is applied over the silicon oxide layer 124 to form a coating layer. The formed coating layer is patterned by a known lithographic technique to form the mask layer 125 provided with the openings 151 and 152. The opening 151 and the opening 152 are formed at the locations to serve as a source region and a drain region.

Figure 1H:
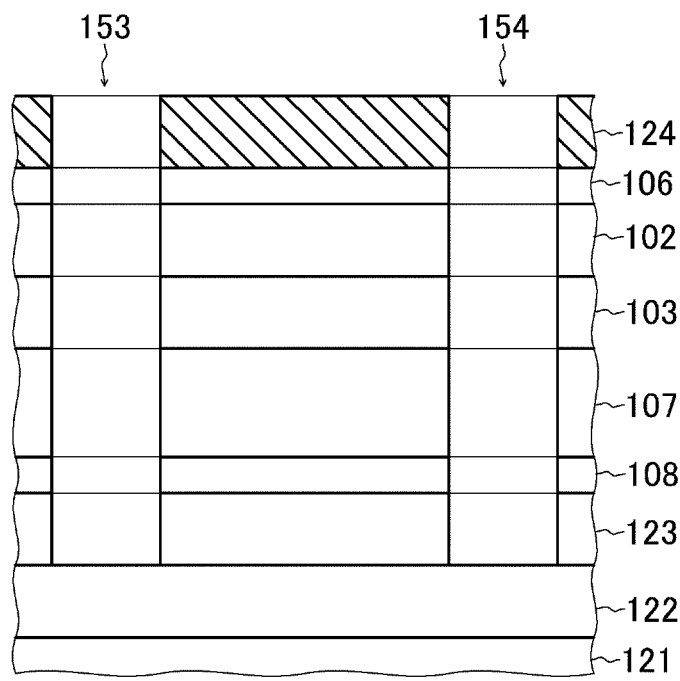
FIG. 1H is a cross-sectional view illustrating a cross section of a transistor in an intermediate stage for describing the manufacturing method for the transistor in the first embodiment of the present invention.

Next, the silicon oxide layer 124 is dry-etched, while using the mask layer 125 as a mask, to form openings in the silicon oxide layer 124 at the same locations as those of the openings 151 and 152 in the mask layer 125. Subsequently, after the mask layer 125 is removed, while using the silicon oxide layer 124 provided with two openings as a mask, each of the layers on the second substrate 121 side (on the lower side) relative to the silicon oxide layer 124 is etched and removed. By this etching process, as illustrated in FIG. 1H, a first groove 153 and a second groove 154 passing through the barrier layer 103 and the channel layer 102 are formed in the barrier layer 103 and the channel layer 102 with a region, in which a gate electrode is to be formed, being interposed therebetween (fifth step).

For example, by reactive ion etching (RIE) with inductive coupled plasma (ICP) using a chlorine-based gas such as Cl$_2$, etching is carried out on the layers from the silicon oxide layer 124, through the gate isolation layer 106, the channel layer 102, the barrier layer 103, the first main bonding layer 107 and the first sub bonding layer 108, to a halfway portion of the second bonding layer 123. By adjusting the etching time, the etching is carried out in the thickness direction down to the halfway portion of the second bonding layer 123. Next, the second bonding layer 123 constituted of GaAs is selectively etched against the etching stop layer 122 made of InGaAsP by wet etching using an etchant in which a basic substance is added in a mixed liquid of citric acid and hydrogen peroxide system so as to achieve a pH value of 6.0 to 8.0. This etching exposes a surface of the etching stop layer 122 to the bottom of the first groove 153 and the second groove 154.

Figure 1I:
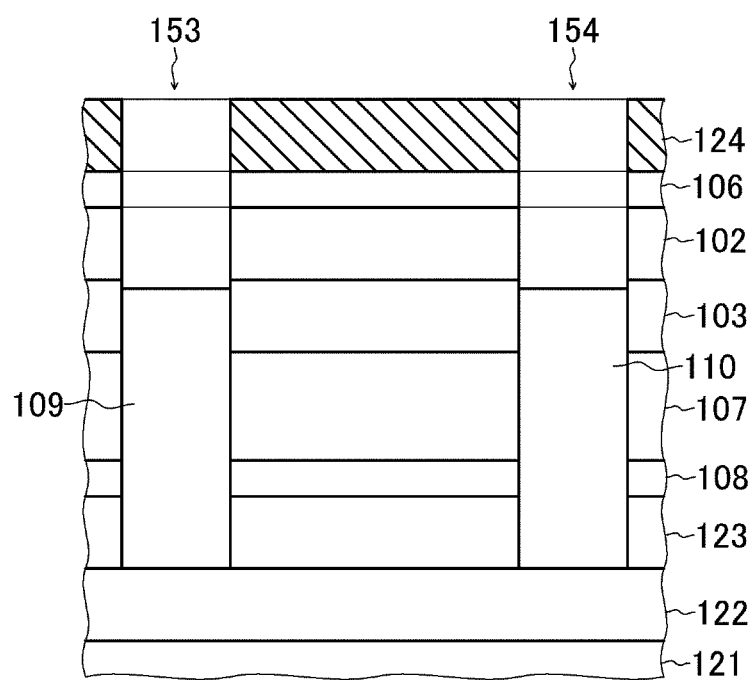
FIG. 1I is a cross-sectional view illustrating a cross section of a transistor in an intermediate stage for describing the manufacturing method for the transistor in the first embodiment of the present invention.

Next, as illustrated in FIG. 1I, a first regrowth layer 109 and a second regrowth layer no made of GaAs with high resistance are regrown on the surface of the etching stop layer 122 exposed to the bottom of the first groove 153 and the second groove 154. The first regrowth layer 109 and the second regrowth layer no are formed up to a height (thickness) that reaches a halfway position in the thickness direction of the barrier layer 103. For example, the first regrowth layer 109 and the second regrowth layer 110 may be formed by causing GaAs with high resistance to crystal-grow by a known method such as metal-organic chemical vapor deposition or molecular beam epitaxy while using the silicon oxide layer 124 as a selective growth mask.

The first regrowth layer 109 and the second regrowth layer no made of GaAs are epitaxially grown to be formed on the etching stop layer 122 made of InGaAsP. Since the etching stop layer 122 is epitaxially grown to be formed on the second substrate 121 made of GaAs, high crystal quality thereof is maintained. Thus, the first regrowth layer 109 and the second regrowth layer no epitaxially grown and formed on the etching stop layer 122 maintaining high crystal quality also maintain high crystal quality.

Figure 1J:
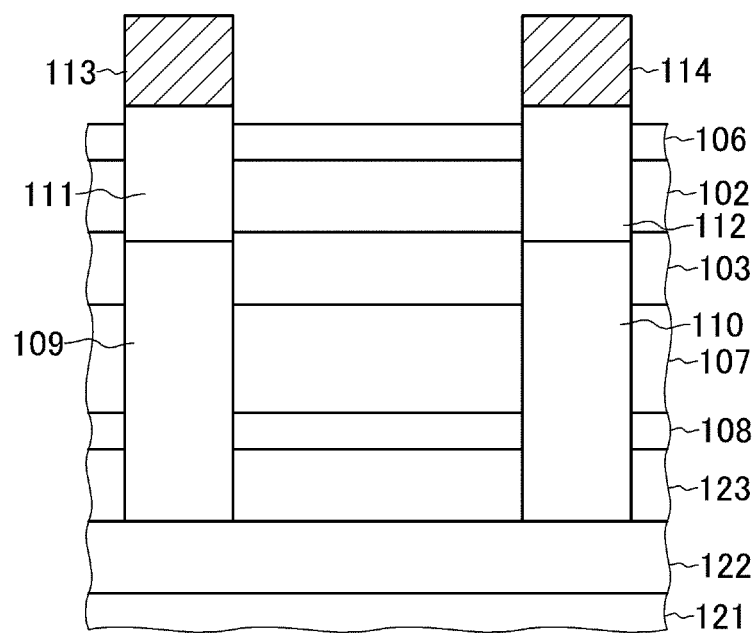
FIG. 1J is a cross-sectional view illustrating a cross section of a transistor in an intermediate stage for describing the manufacturing method for the transistor in the first embodiment of the present invention.

Next, as illustrated in FIG. 1J, a source region iii and a drain region 112 configured to make contact with the channel layer 102 are formed in the first groove 153 and the second groove 154 respectively (sixth step), and a source electrode 113 to be ohmic-connected is formed on the source region iii and a drain electrode 114 to be ohmic-connected is formed on the drain region 112 (seventh step).

For example, by n-type InGaAs being regrown on the first regrowth layer 109 and the second regrowth layer 110, the source region iii and the drain region 112 configured to make contact with the channel layer 102 are formed in the first groove 153 and the second groove 154 respectively. The n-type InGaAs is a semiconductor not containing nitrogen in which impurities are injected. For example, n-type InGaAs heavily doped with Si as a dopant at a concentration of equal to or greater than $1e10^{19}$ cm$^{-3}$ is crystal-grown by a known method such as metal-organic chemical vapor deposition or molecular beam epitaxy while using the silicon oxide layer 124 as a selective growth mask, thereby forming the source region 111 and the drain region 112. The source region 111 and the drain region 112 are so formed that the top surfaces thereof are disposed above the gate isolation layer 106.

As previously mentioned, the first regrowth layer 109 and the second regrowth layer no maintain high crystal quality, and the source region 111 and the drain region 112 epitaxially grown thereupon also maintain high crystal quality. The source region 111 and the drain region 112 made of InGaAs may have a higher impurity concentration than a nitride semiconductor, and may have lower resistance than the nitride semiconductor.

Next, after the silicon oxide layer 124 is removed, the source electrode 113 and the drain electrode 114 are formed by depositing an electrode material (metal) capable of forming an ohmic contact by using a known method such as vapor deposition or sputtering. Examples of the electrode material capable of forming the ohmic contact include Ti, Pt, and Au. The above electrode materials are able to achieve a significantly low contact resistance with respect to InGaAS, for example, even in a non-alloy state. In the non-alloy state, the ohmic contact is not formed in the GaN layer (channel layer 102) via the AlGaN layer (gate isolation layer 106). After an electrode material layer is formed by depositing the electrode material, the electrode material layer is patterned by a known lithographic technique and a known etching technique, thereby forming the source electrode 113 and the drain electrode 114. It is also possible to form the source electrode 113 and the drain electrode 114 by a well-known lift off method.

Figure 1K:
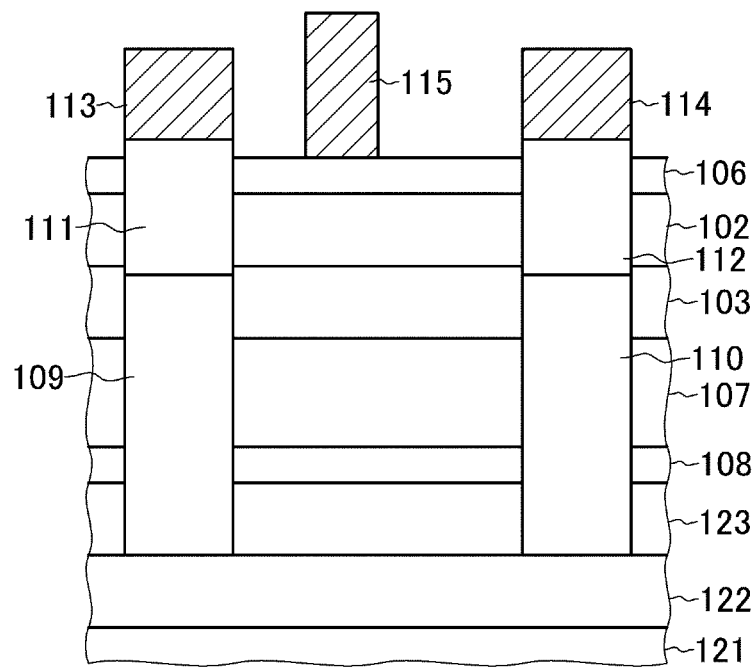
FIG. 1K is a cross-sectional view illustrating a cross section of a transistor in an intermediate stage for describing the manufacturing method for the transistor in the first embodiment of the present invention.

Next, as illustrated in FIG. 1K, a gate electrode 115 is formed over the barrier layer 103 and the channel layer 102 between the source electrode 113 and the drain electrode 114 (eighth step). In the first embodiment, the gate electrode 115 to be Schottky-connected is formed on the gate isolation layer 106. For example, the gate electrode 115 may be constituted of a gate metal material such as Ni or Au. After a gate metal material layer is formed by depositing the gate metal material, the gate metal material is patterned by a known lithographic technique and a known etching technique, thereby forming the gate electrode 115. In the first embodiment, the gate isolation layer 106 constituted of a material having a larger band gap than that of the channel layer 102 is formed on the channel layer 102, and the gate electrode 115 to be Schottky-connected is formed on the gate isolation layer 106.

According to the first embodiment described above, since the source electrode 113, the drain electrode 114, and the channel layer 102 are in contact with one another via the source region iii and the drain region 112 having low resistance as compared to a nitride semiconductor, the contact resistance of the source and drain electrodes of a GaN-based HEMT can be reduced in comparison with the techniques of the related art. As a result, according to embodiments of the present invention, high frequency characteristics of the GaN-based HEMT can be further extended, thereby making it possible to broaden the band.

Second Embodiment

Next, a manufacturing method for a transistor in a second embodiment of the present invention will be described with reference to FIGS. 2A to 2I.

Figure 2A:
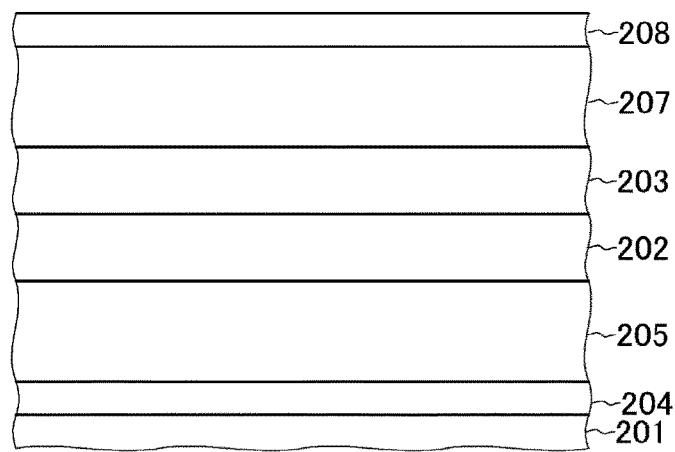
FIG. 2A is a cross-sectional view illustrating a cross section of a transistor in an intermediate stage for describing a manufacturing method for the transistor in a second embodiment of the present invention.

First, as illustrated in FIG. 2A, a barrier layer 202 and a channel layer 203 made of a nitride semiconductor are formed on a first substrate 201 (first step). In the second embodiment, the barrier layer 202 and the channel layer 203 are grown on the first substrate 201 in that order by the crystal growth in the −c-axis direction. Further in the second embodiment, after a nucleation layer 204 and a sacrificial layer 205 are formed on the first substrate 201, the barrier layer 202 and the channel layer 203 are formed, and a first main bonding layer 207 and a first sub bonding layer 208 are formed on the barrier layer 202. The nucleation layer 204, the sacrificial layer 205, the first main bonding layer 207, and the first sub bonding layer 208 are also formed by the crystal growth in the −c-axis direction. Due to the crystal growth in the −c-axis direction, by forming the channel layer 203 on the barrier layer 202, a sheet carrier heavily concentrated at approximately $10^{13}$ cm$^{-3}$ is formed spontaneously in a heterojunction between the barrier layer 202 and the channel layer 203.

The first substrate 201 is constituted of, for example, $Al_2O_3$, and the plane orientation of the principal surface is, for example, (0001). The first substrate 201 is constituted of a material that can be used for growing a nitride semiconductor such as GaN. As will be described later, for removing the first substrate 201, for example, it is more preferable to use Si, which makes it possible to remove the substrate by dry etching, or $Al_2O_3$, which makes it possible to apply a known peeling technique such as laser lift off, but the present invention is not limited thereto.

The nucleation layer 204 is constituted of GaN, for example. As is well known, the nucleation layer 204 is a layer configured to support the nucleation of the initial growth to obtain a high quality and flat crystal in order to grow the crystal of a nitride semiconductor such as GaN on different kinds of substrates of $Al_2O_3$, Si, SiC, and the like. The nucleation layer 204 has various nomenclatures such as a low temperature buffer layer and a low temperature buffer.

When the surface of the first substrate 201 made of $Al_2O_3$ is subjected to nitriding, and GaN is epitaxially grown on the surface of the first substrate 201 having experienced the nitriding by a well-known metal-organic chemical vapor deposition method, the nucleation layer 204 with the principal surface being a group V polar face can be formed. By making the surface of the nucleation layer 204 be a group V polar face, the nitride semiconductor crystal grows in the −c-axis direction thereupon. The nucleation layer 204 is not limited to GaN, and may also be constituted of other nitride materials such as AlN. Note that in a case where the first substrate 201 is constituted of GaN, the nucleation layer 204 is not necessary.

The sacrificial layer 205 is constituted of GaN, for example. The sacrificial layer 205 is used to remove the first substrate 201, which will be described later, and is used to flatten the surface of the semiconductor layer structure after removing the first substrate 201. For this purpose, the thickness of the sacrificial layer 205 is set as appropriate to be, for example, equal to or thicker than wo nm in accordance with a removal process of the first substrate 201. The sacrificial layer 205, together with the nucleation layer 204, also functions as a buffer layer for a layer to crystal-grow above the sacrificial layer 205.

The channel layer 203 is constituted of GaN, for example. The barrier layer 202 is constituted of AlGaN. The thickness of the channel layer 203 and the thickness of the barrier layer 202 are determined in consideration of the desired sheet resistance and mobility of the HEMT, the critical film thickness of the entire layered structure to epitaxially grow, and the like. The barrier layer 202 may be formed in contact with the channel layer 203, and it is possible to dispose a spacer layer constituted of AlN, for example, between the barrier layer 202 and the channel layer 203. In addition, the barrier layer 202 constituted of AlGaN may also have a configuration in which, for example, the Al composition gradually changes in a direction away from the channel layer 203 relative to the channel layer 203 side.

The first main bonding layer 207 is constituted of GaN, and the first sub bonding layer 208 is constituted of GaN, which is doped with C to have high resistance. By constituting the bonding layers formed of a plurality of layers in this manner, it is possible to suppress the introduction of crystal defects into the channel layer 203 and the barrier layer 202 in the bonding process to be described later. It is also possible for each of the layers described above to be formed by a well-known method such as metal-organic chemical vapor deposition or molecular beam epitaxy.

Figure 2B:
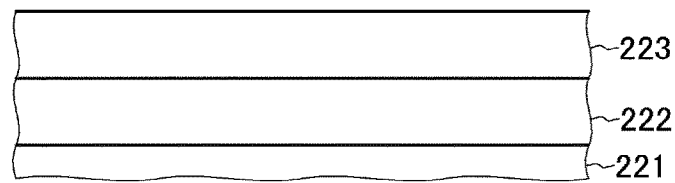
FIG. 2B is a cross-sectional view illustrating a cross section of a transistor in an intermediate stage for describing the manufacturing method for the transistor in the second embodiment of the present invention.

Next, as illustrated in FIG. 2B, a second substrate 221 made of a semiconductor not containing nitrogen is prepared (second step). The second substrate 221 is constituted of a material able to regrow a material that can be more heavily doped with impurities and is easily reduced in resistance when forming the source region and the drain region by a regrowth process to be explained later. Examples of the material that can be more heavily doped with impurities and is easily reduced in resistance include a nitrogen-free group III-V compound semiconductor such as GaAs. In the second embodiment as well, the second substrate 221 is constituted of GaAs with high resistance.

In the second embodiment as well, an etching stop layer 222 made of InGaAsP is formed on the second substrate 221 by epitaxial growth, and a second bonding layer 223 made of GaAs with high resistance is formed.

Figure 2C:
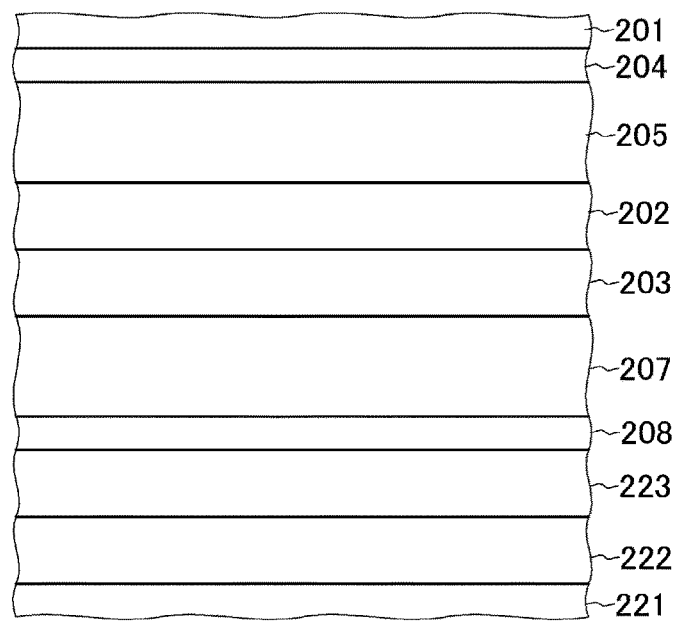
FIG. 2C is a cross-sectional view illustrating a cross section of a transistor in an intermediate stage for describing the manufacturing method for the transistor in the second embodiment of the present invention.

Next, as illustrated in FIG. 2C, the second substrate 221 is bonded to the side of the barrier layer 202 and the channel layer 203 of the first substrate 201 (third step). In the second embodiment as well, the second bonding layer 223 of the second substrate 221 is bonded to the first sub bonding layer 208 of the first substrate 201, thereby bonding the first substrate 201 and the second substrate 221 to each other. The above bonding process is the same as that of the first embodiment.

Figure 2D:
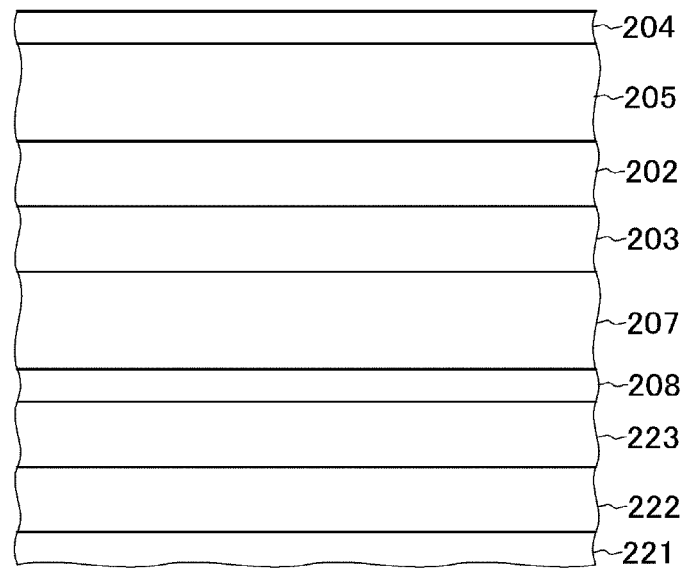
FIG. 2D is a cross-sectional view illustrating a cross section of a transistor in an intermediate stage for describing the manufacturing method for the transistor in the second embodiment of the present invention.

Next, similarly to the first embodiment, the first substrate 201 is removed to obtain a state in which, as illustrated in FIG. 2D, the channel layer 203 and the barrier layer 202 are formed in that order on the second substrate 221 (fourth step). In the second embodiment, the etching stop layer 222, the second bonding layer 223, the first sub bonding layer 208, the first main bonding layer 207, the channel layer 203, the barrier layer 202, the sacrificial layer 205, and the nucleation layer 204 are formed in that order on the second substrate 221. In the second embodiment, when viewed from the second substrate 221, the barrier layer 202 is formed on the channel layer 203.

Next, the sacrificial layer 205 is thinned. The sacrificial layer 205 is removed to expose the surface of the barrier layer 202 as described below. In removing the sacrificial layer 205, for example, an etching process is used in which the sacrificial layer 205 serves as an etching stop layer. The sacrificial layer 205 is thinned in accordance with the magnitude of the etch selectivity that may be taken between the barrier layer 202 and the sacrificial layer 205 in the stated etching process. In removing the sacrificial layer 205 by the etching process, the flatness of the surface of the sacrificial layer 205 may be transferred to the surface of the barrier layer 202. As such, the sacrificial layer 205 is thinned and the surface thereof is flattened.

For example, by CMP, the sacrificial layer 205 is ground and polished so as to flatten the surface of the sacrificial layer 205 and thin the sacrificial layer 205. The thickness of the sacrificial layer 205, which is shaved by the CMP, depends on a state of the removal of the first substrate 201 in the previous process, and a state of the sacrificial layer 205 after the removal of the first substrate 201. For example, when surface roughness of the sacrificial layer 205 is several nanometers in size due to the removal of the first substrate 201, grinding and polishing of a thickness of approximately several hundred nanometers is carried out by the CMP in order to remove portions of the sacrificial layer 205 damaged in terms of flatness across the entire area in the planar direction. In the case where the sacrificial layer 205 is formed to have a thickness of 1000 nm or greater, not all of the sacrificial layer 205 is lost even when it is thinned by the CMP discussed above.

Figure 2E:
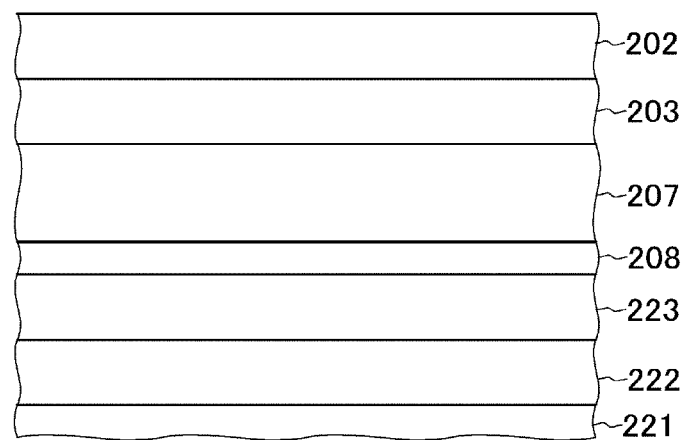
FIG. 2E is a cross-sectional view illustrating a cross section of a transistor in an intermediate stage for describing the manufacturing method for the transistor in the second embodiment of the present invention.

Subsequently, the thinned sacrificial layer 205 is removed to expose the surface of the barrier layer 202, as illustrated in FIG. 2E. Since the sacrificial layer 205 is constituted of GaN, and the barrier layer 202 is constituted of AlGaN, it is possible to remove the sacrificial layer 205 by a dry etching process using a chlorine gas, nitrogen gas, or oxygen gas, for example, with the barrier layer 202 serving as an etching stop layer.

Figure 2F:
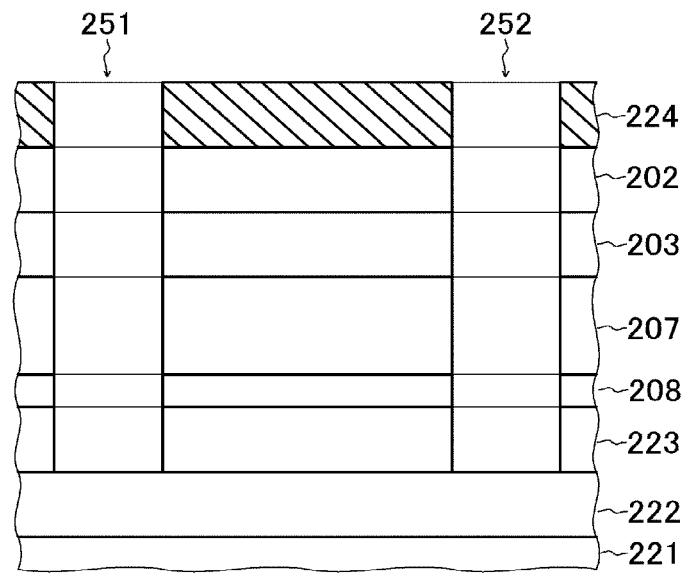
FIG. 2F is a cross-sectional view illustrating a cross section of a transistor in an intermediate stage for describing the manufacturing method for the transistor in the second embodiment of the present invention.

Next, as illustrated in FIG. 2F, a silicon oxide mask 224 provided with openings at the locations to serve as a source region and a drain region is formed on the barrier layer 202. The silicon oxide mask 224 is formed in a similar manner to that of the formation of the silicon oxide layer 124 described above with reference to FIG. 1G.

Subsequently, while using the silicon oxide mask 224 as a mask, each of the layers on the second substrate 221 side (on the lower side) relative to the silicon oxide mask 224 is etched and removed. By this etching process, a first groove 251 and a second groove 252 passing through the barrier layer 202 and the channel layer 203 are formed in the barrier layer 202 and the channel layer 203 with a region, in which a gate electrode is to be formed, being interposed therebetween (fifth step).

For example, by reactive ion etching (RIE) with inductive coupled plasma (ICP) using a chlorine-based gas such as $Cl_2$, etching is carried out on the layers from the silicon oxide mask 224, through the channel layer 203, the barrier layer 202, the first main bonding layer 207 and the first sub bonding layer 208, to a halfway portion of the second bonding layer 223. By adjusting the etching time, the etching is carried out in the thickness direction down to the halfway portion of the second bonding layer 223. Next, the second bonding layer 223 made of GaAs is selectively etched against the etching stop layer 222 made of InGaAsP by wet etching using an etchant in which a basic substance is added in a mixed liquid of citric acid and hydrogen peroxide system so as to achieve a pH value of 6.0 to 8.0. This etching exposes a surface of the etching stop layer 222 to the bottom of the first groove 251 and the second groove 252.

Figure 2G:
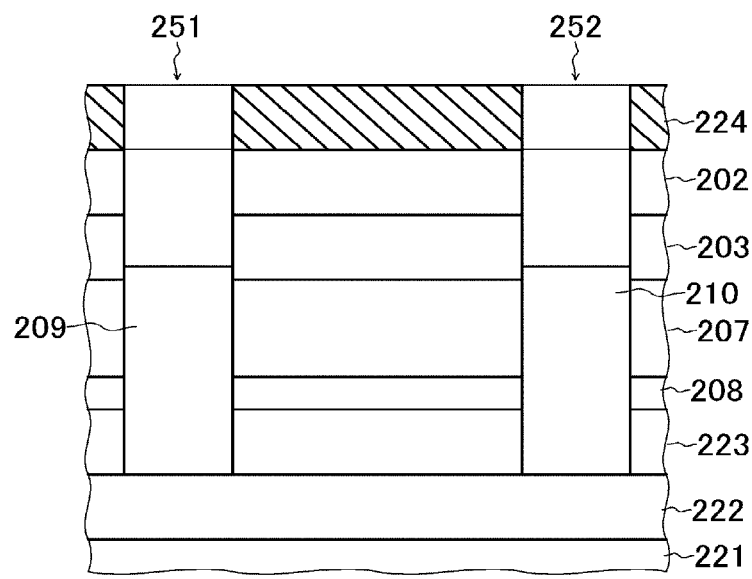
FIG. 2G is a cross-sectional view illustrating a cross section of a transistor in an intermediate stage for describing the manufacturing method for the transistor in the second embodiment of the present invention.

Next, as illustrated in FIG. 2G, a first regrowth layer 209 and a second regrowth layer 210 made of GaAs with high resistance are regrown on the surface of the etching stop layer 222 exposed to the bottom of the first groove 251 and the second groove 252. The first regrowth layer 209 and the second regrowth layer 210 are formed up to a height (thickness) that reaches a halfway position in the thickness direction of the channel layer 203. The first regrowth layer 209 and the second regrowth layer 210 may be formed to have a thickness to reach a halfway position in the thickness direction of the first main bonding layer 207. The channel layer 203 is exposed to side surfaces of the first groove 251 and the second groove 252 above the first regrowth layer 209 and the second regrowth layer 210. For example, the first regrowth layer 209 and the second regrowth layer 210 may be formed by causing GaAs with high resistance to crystal-grow by a known method such as metal-organic chemical vapor deposition or molecular beam epitaxy while using the silicon oxide mask 224 made of silicon oxide as a selective growth mask.

The first regrowth layer 209 and the second regrowth layer 210 made of GaAs are epitaxially grown to be formed on the etching stop layer 222 made of InGaAsP. Since the etching stop layer 222 is epitaxially grown to be formed on the second substrate 221 made of GaAs, high crystal quality thereof is maintained. Thus, the first regrowth layer 209 and the second regrowth layer 210 epitaxially grown to be formed on the etching stop layer 222 maintaining high crystal quality also maintain high crystal quality.

Figure 2H:
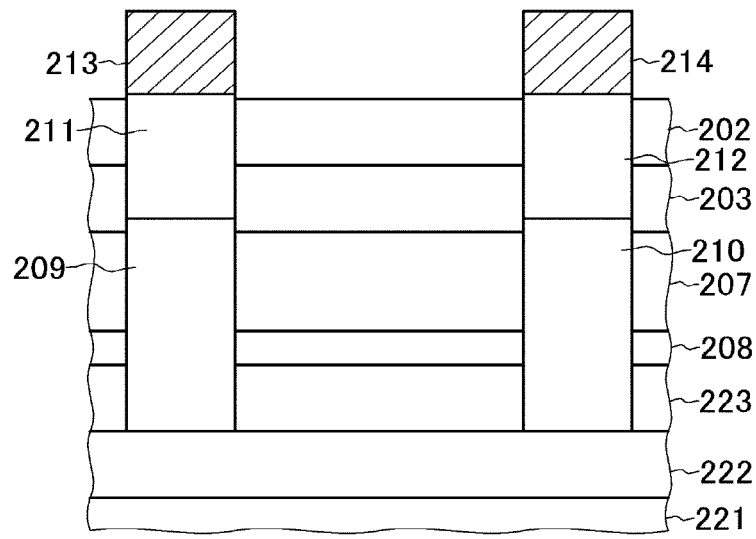
FIG. 2H is a cross-sectional view illustrating a cross section of a transistor in an intermediate stage for describing the manufacturing method for the transistor in the second embodiment of the present invention.

Next, as illustrated in FIG. 2H, a source region 211 and a drain region 212 configured to make contact with the channel layer 203 are formed in the first groove 251 and the second groove 252 respectively (sixth step), and a source electrode 213 to be ohmic-connected is formed on the source region 211 and a drain electrode 214 to be ohmic-connected is formed on the drain region 212 (seventh step).

For example, by n-type InGaAs being regrown on the first regrowth layer 209 and the second regrowth layer 210, the source region 211 and the drain region 212 configured to make contact with the channel layer 203 are formed in the first groove 251 and the second groove 252 respectively. The n-type InGaAs is a semiconductor not containing nitrogen in which impurities are injected. For example, n-type InGaAs heavily doped with Si as a dopant at a concentration of equal to or greater than $1e10^{19}$ cm$^{-3}$ is crystal-grown by a known method such as metal-organic chemical vapor deposition or molecular beam epitaxy while using the silicon oxide mask 224 as a selective growth mask, thereby forming the source region 211 and the drain region 212. The source region 211 and the drain region 212 are so formed that the top surfaces thereof are disposed above the barrier layer 202.

As previously mentioned, the first regrowth layer 209 and the second regrowth layer 210 maintain high crystal quality, and the source region 211 and the drain region 212 epitaxially grown thereupon also maintain high crystal quality. The source region 211 and the drain region 212 made of InGaAs may have a higher impurity concentration than a nitride semiconductor, and may have lower resistance than the nitride semiconductor.

Next, after the silicon oxide mask 224 is removed, the source electrode 213 and the drain electrode 214 are formed by depositing an electrode material (metal) capable of forming an ohmic contact by using a known method such as vapor deposition or sputtering. Examples of the electrode material capable of forming the ohmic contact include Ti, Pt, and Au. The above electrode materials are able to achieve a significantly low contact resistance with respect to InGaAS, for example, even in a non-alloy state. In the non-alloy state, the ohmic contact is not formed in the GaN layer (channel layer 203) via the AlGaN layer (barrier layer 202). After an electrode material layer is formed by depositing the electrode material, the electrode material layer is patterned by a known lithographic technique and a known etching technique, thereby forming the source electrode 213 and the drain electrode 214. It is also possible to form the source electrode 213 and the drain electrode 214 by a well-known lift off method.

Figure 2I:
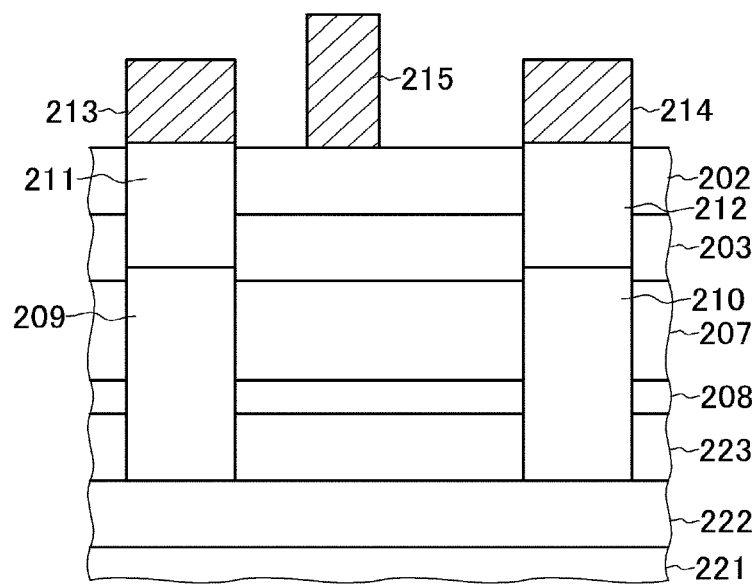
FIG. 2I is a cross-sectional view illustrating a cross section of a transistor in an intermediate stage for describing the manufacturing method for the transistor in the second embodiment of the present invention.
Figure 3:
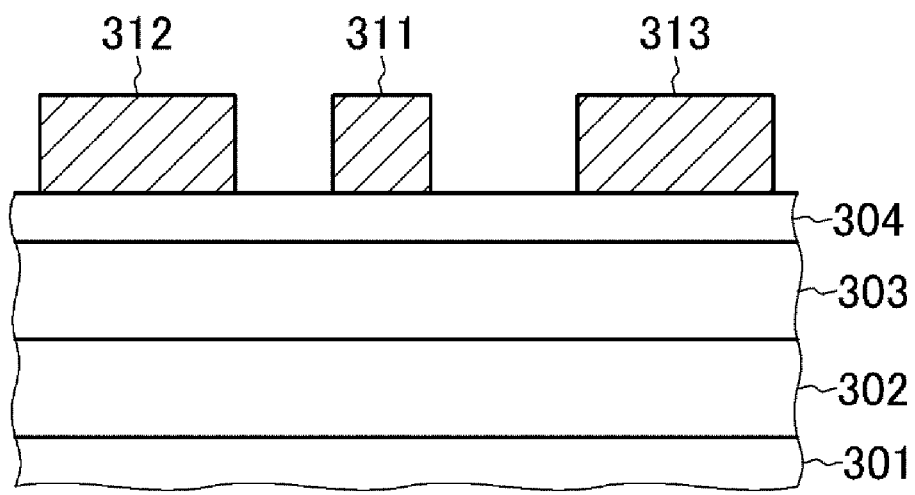
FIG. 3 is a cross-sectional view illustrating a configuration of a high electron mobility transistor.

Next, as illustrated in FIG. 2I, a gate electrode 215 is formed over the channel layer 203 and the barrier layer 202 between the source electrode 213 and the drain electrode 214 (eighth step). In the second embodiment, the gate electrode 215 to be Schottky-connected is formed on the barrier layer 202. For example, the gate electrode 215 may be constituted of a gate metal material such as Ni or Au. After a gate metal material layer is formed by depositing the gate metal material, the gate metal material is patterned by a known lithographic technique and a known etching technique, thereby forming the gate electrode 215.

In the second embodiment as well, since the source electrode 213, the drain electrode 214, and the channel layer 203 are in contact with one another via the source region 211 and the drain region 212 having low resistance as compared to a nitride semiconductor, the contact resistance of the source and drain electrodes of a GaN-based HEMT can be reduced in comparison with the techniques of the related art. As a result, according to embodiments of the present invention, high frequency characteristics of the GaN-based HEMT can be further extended, thereby making it possible to broaden the band.

As described above, in embodiments of the present invention, a second substrate made of a semiconductor with no nitrogen contained is bonded to a first substrate on which crystals of a barrier layer and a channel layer made of a nitride semiconductor are grown in the c-axis direction, a first groove and a second groove are formed passing through the barrier and channel layers after having removed the first substrate, and a source region and a drain region in contact with the channel layer are formed in the first groove and the second groove. As a result, according to embodiments of the present invention, the contact resistance of the source and drain electrodes of a transistor using a nitride semiconductor may be further decreased.

In the case where the first substrate is constituted of Si, the first substrate can be removed by dry etching, and can be selectively removed from the layers made of a GaN-based material, such as a nucleation layer. In a case where the first substrate is constituted of SiC or GaN, it is possible to epitaxially grow a layer made of a GaN-based material, and a high quality crystal is likely to be obtained. However, from the perspective of removing the first substrate, technical improvements need to be devised for the buffer layer and the like. It goes without saying that, even in a case where the first substrate is constituted of SiC, GaN, or the like, embodiments of the present invention are sufficiently applicable as long as the removal of the first substrate can be carried out over a wide range without the channel layer, the barrier layer, and the like being damaged.

In the embodiments described above, GaN is used as a nucleation layer, but it is also possible to form the nucleation layer of AlN, AlGaN, AlON, or the like, for example, within a range where there arise no problems regarding the removal process of the first substrate and characteristics of the HEMT. Likewise, the case in which GaN is used as a sacrificial layer is exemplified, but it is also possible to use a method in which GaN having different growth conditions is grown over multiple stages, for example, in order to make the quality of the crystal further improved, or the like. A layer of GaN formed by using a growth method in which a mask to promote a growth in a lateral direction is used, for example, may also be used as the sacrificial layer.

Although the case in which the etching stop layer is constituted of AlGaN is described above as an example, another material may also be used for the etching stop layer within a range of the object to stop the etching. In the case where GaN is used for the sacrificial layer, the use of a layer containing Al as an etching stop layer is advantageous from the perspective of obtaining selectivity by a method such as dry etching or pyrolysis. Note that, in essence, it is an object to expose the channel layer, the barrier layer, and the like in a state or cause them to approach a region near the surface, where the process can be carried out thereupon; accordingly, it is unnecessary to provide the etching stop layer as long as the above object can be achieved without using the etching stop layer as discussed above.

In the embodiments described above, the channel layer is constituted of GaN and the barrier layer is constituted of AlGaN, but the present invention is not limited thereto. For example, the channel layer may be constituted of InGaN, InN, or AlGaN, and the channel layer may have a heterostructure like GaN or InGaN. The barrier layer may also be constituted of InAlN, InAlGaN, AlN, or GaN, and may have a multilayer structure by a combination of these materials.

The HEMT is exemplified and explained in the above description, and embodiments of the present invention may also be applied to other transistors, photodiodes, modulators, and the like.

To increase the resistance of the nitride semiconductor, C is used as a dopant, and it is also possible to use, for example, Zn, Fe, or the like as a dopant. In a case where damage brought about by the bonding falls within a range where the impact on the device characteristics is tolerable, it is unnecessary to use the bonding layer.

In a case where the second substrate is constituted of GaAs having high resistance, it is possible for the etching stop layer to be constituted of a material containing P such as InGaAsP or InGaP, or a material containing Al such as AlGaAs from the perspective of stopping the etching by wet etching. In a case where the second substrate is constituted of InP having high resistance, it is possible to use a layer containing As, such as InAlAs or InGaAs, as an etching stop layer. Furthermore, as for the second bonding layer formed on the second substrate, GaAs having high resistance, InP having high resistance, or the like may be selected in accordance with the second substrate.

The present invention is not limited to the embodiments described above, and it is obvious that many modifications and combinations can be implemented by a person having ordinary knowledge in the field within the technical spirit of the present invention.

REFERENCE SIGNS LIST

101 First substrate
102 Channel layer
103 Barrier layer
104 Nucleation layer
105 Sacrificial layer
105a Sacrificial layer
106 Gate isolation layer
107 First main bonding layer
108 First sub bonding layer
109 First regrowth layer
110 Second regrowth layer
111 Source region
112 Drain region
113 Source electrode
114 Drain electrode
115 Gate electrode
121 Second substrate
122 Etching stop layer
123 Second bonding layer
124 Silicon oxide layer
125 Mask layer
151 Opening
152 Opening
153 First groove
154 Second groove

The invention claimed is:

1. A manufacturing method for a transistor, comprising:
(i) growing crystals of a barrier layer and a channel layer made of a nitride semiconductor in a c-axis direction on a first substrate;
(ii) preparing a second substrate made of a semiconductor with no nitrogen contained;
(iii) bonding the second substrate to the barrier layer on the first substrate;
(iv) removing the first substrate, wherein the barrier layer and the channel layer remain on the second substrate;
(v) forming, after the first substrate is removed, a first groove and a second groove in the barrier layer and the channel layer, the first groove and the second groove passing through the barrier layer and the channel layer with a region in which a gate electrode is to be formed interposed between the first groove and the second groove;
(vi) forming, in the first groove and the second groove, respectively, a source region and a drain region in contact with the channel layer by regrowing a semiconductor with no nitrogen contained in which impurities are injected from a side of a bottom surface of the first groove and from a side of a bottom surface of the second groove;
(vii) forming a source electrode to be ohmic-connected on the source region and forming a drain electrode to be ohmic-connected on the drain region; and
(viii) forming the gate electrode over the barrier layer and the channel layer between the source electrode and the drain electrode.

2. The manufacturing method for the transistor according to claim 1, wherein:
a first bonding layer is formed on the barrier layer in step (i);
a second bonding layer is formed on the second substrate in step (ii); and
the first substrate and the second substrate are bonded to each other in a state in which the first bonding layer and the second bonding layer face each other in step (iii).

3. The manufacturing method for the transistor according to claim 1, wherein the first substrate is removed along with part of the barrier layer in step (iv).

4. The manufacturing method for the transistor according to claim 1, wherein:
the barrier layer and the channel layer are formed on the first substrate with a sacrificial layer interposed between the first substrate and the barrier layer or the channel layer in step (i); and
the first substrate is removed along with part of the sacrificial layer in step (iv).

5. The manufacturing method for the transistor according to claim 1, wherein:
in step (i), the channel layer and the barrier layer are grown to be formed in that order on the first substrate by crystal growth in a +c-axis direction, and a gate isolation layer comprising a material having a larger band gap than a band gap of the channel layer is formed in contact with the channel layer between the first substrate and the channel layer; and
in step (viii), the gate electrode is formed on the gate isolation layer.

6. The manufacturing method for the transistor according to claim 1, wherein:
the barrier layer and the channel layer are grown to be formed in that order on the first substrate by crystal growth in a–c-axis direction in step (i); and
the gate electrode is formed on the barrier layer in step (viii).

7. The manufacturing method for the transistor according to claim 6, wherein:
the first substrate comprises sapphire, Si, SiC, GaN, or AlN; and
the second substrate comprises GaAs, InP, or Si.

8. The manufacturing method for the transistor according to claim 1, wherein:
the first substrate comprises sapphire, Si, SiC, GaN, or AlN; and
the second substrate comprises GaAs, InP, or Si.

9. The manufacturing method for the transistor according to claim 1, wherein:
the channel layer comprises GaN, InGaN, InN or AlGaN, or a layered structure comprising materials selected from the group consisting of GaN, InGaN, InN and AlGaN; and the barrier layer comprises AlGaN, InAlN, InAlGaN, AlN or GaN, or a layered structure comprising materials selected from the group consisting of AlGaN, InAlN, InAlGaN, AlN and GaN.

10. A manufacturing method for a transistor, comprising:
(i) forming a nucleation layer on a first substrate;
(ii) forming a sacrificial layer on the nucleation layer;
(iii) forming a gate isolation layer on the sacrificial layer;
(iv) forming a channel layer of a first nitride semiconductor on the gate isolation layer, wherein forming the channel layer comprises growing crystals in a c-axis direction;
(v) forming a barrier layer of a second nitride semiconductor on the channel layer, wherein forming the barrier layer comprises growing crystals in the c-axis direction;
(vi) forming a first bonding layer on the barrier layer;
(vii) forming an etching stop layer on a second substrate made of a semiconductor with no nitrogen contained;
(viii) forming a second bonding layer on the etching stop layer;
(ix) bonding the first substrate and the second substrate by bonding the second bonding layer to the first bonding layer;
(x) removing the first substrate;
(xi) exposing a surface of the gate isolation layer by removing the sacrificial layer;
(xii) forming, after the sacrificial layer is removed, a first groove and a second groove through the barrier layer and the channel layer, wherein a region in which a gate electrode is to be formed is interposed between the first groove and the second groove; and
(xiii) forming, in the first groove and the second groove, respectively, a source region and a drain region in contact with the channel layer by regrowing a semiconductor with no nitrogen contained in which impurities are injected from a side of a bottom surface of the first groove and from a side of a bottom surface of the second groove.

11. The manufacturing method for the transistor according to claim 10, further comprising:
(xiv) forming a source electrode to be ohmic-connected on the source region and forming a drain electrode to be ohmic-connected on the drain region; and
(xv) forming the gate electrode over the barrier layer and the channel layer between the source electrode and the drain electrode.

12. The manufacturing method for the transistor according to claim 10, wherein forming the nucleation layer, forming the sacrificial layer, forming the gate isolation layer, and forming the first bonding layer each comprise growing crystals in the c-axis direction.

13. The manufacturing method for the transistor according to claim 10, wherein:
the first substrate comprises sapphire, Si, SiC, GaN, or AlN; and
the second substrate comprises GaAs, InP, or Si.

14. The manufacturing method for the transistor according to claim 13, wherein:
the channel layer comprises GaN, InGaN, InN or AlGaN, or a layered structure comprising materials selected from the group consisting of GaN, InGaN, InN and AlGaN; and
the barrier layer comprises AlGaN, InAlN, InAlGaN, AlN or GaN, or a layered structure comprising materials selected from the group consisting of AlGaN, InAlN, InAlGaN, AlN and GaN.

15. The manufacturing method for the transistor according to claim 10, wherein:
the channel layer comprises GaN, InGaN, InN or AlGaN, or a layered structure comprising materials selected from the group consisting of GaN, InGaN, InN and AlGaN; and
the barrier layer comprises AlGaN, InAlN, InAlGaN, AlN or GaN, or a layered structure comprising materials selected from the group consisting of AlGaN, InAlN, InAlGaN, AlN and GaN.

16. The manufacturing method for the transistor according to claim 10, wherein forming the first bonding layer in step (vi) further comprises:
forming a first main bonding layer on the barrier layer; and
forming a first sub bonding layer on the first main bonding layer.

17. The manufacturing method for the transistor according to claim 16, wherein bonding the first substrate and the second substrate in step (ix) comprises bonding the second bonding layer to the first sub bonding layer.

* * * * *